(12) United States Patent
Mazzocco et al.

(10) Patent No.: US 10,196,845 B2
(45) Date of Patent: Feb. 5, 2019

(54) SUBSTRATE CARRIER DOOR ASSEMBLIES, SUBSTRATE CARRIERS, AND METHODS INCLUDING MAGNETIC DOOR SEAL

(71) Applicant: Applied Materials, Inc., Santa Clara, CA (US)

(72) Inventors: John J. Mazzocco, San Jose, CA (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 454 days.

(21) Appl. No.: 15/130,272

(22) Filed: Apr. 15, 2016

(65) Prior Publication Data

US 2016/0340947 A1 Nov. 24, 2016

Related U.S. Application Data

(60) Provisional application No. 62/165,555, filed on May 22, 2015.

(51) Int. Cl.
*H01L 21/67* (2006.01)
*E05C 19/16* (2006.01)
*H01L 21/673* (2006.01)

(52) U.S. Cl.
CPC ...... *E05C 19/166* (2013.01); *H01L 21/67373* (2013.01); *H01L 21/67376* (2013.01); *H01L 21/67393* (2013.01)

(58) Field of Classification Search
USPC ................................................ 206/710, 711
See application file for complete search history.

(56) References Cited

U.S. PATENT DOCUMENTS

| 5,398,481 A | 3/1995 | Takeuchi et al. |
| 6,336,567 B1 | 1/2002 | Hyobu |
(Continued)

FOREIGN PATENT DOCUMENTS

JP 2003-229476 8/2003

OTHER PUBLICATIONS

Rice et al., U.S. Appl. No. 14/931,520, titled: Substrate Processing Systems, Apparatus, and Methods With Substrate Carrier and Purge Chamber Environmental Controls, filed Nov. 3, 2015.
(Continued)

*Primary Examiner* — Jacob K Ackun
(74) *Attorney, Agent, or Firm* — Dugan & Dugan, PC

(57) ABSTRACT

A substrate carrier door assembly including relatively high sealing force that can be modulated. Substrate carrier door assembly includes a carrier door configured to seal to a carrier body, a first attraction member on the carrier body, and a second attraction member on the carrier door. Attraction members are selected from a group of a magnetic material and a permanent magnet. Substrate carrier door assembly includes a magnetic field generator energizable to reduce attraction force between the attraction members making the carrier door relatively easier to remove, yet providing enhanced sealing when not energized. Substrate carriers including the substrate carrier door assembly and methods of processing substrates are provided. A substrate carrier including a port configured to allow gas to be injected into, or removed from, a carrier chamber, and a magnetic port seal is also disclosed, as are numerous other aspects.

8 Claims, 8 Drawing Sheets

(56) References Cited

U.S. PATENT DOCUMENTS

| | | |
|---|---|---|
| 7,909,167 B2 | 3/2011 | Chiu et al. |
| 8,074,597 B2 | 12/2011 | Shah et al. |
| 8,424,703 B2 | 4/2013 | Meulen |
| 2007/0140822 A1 | 6/2007 | Elliott et al. |
| 2007/0175792 A1 | 8/2007 | Gregerson |
| 2009/0272743 A1 | 11/2009 | Meulen |
| 2010/0282638 A1 | 11/2010 | Chiu et al. |
| 2012/0220107 A1* | 8/2012 | Fukuda ............. H01L 21/67309 438/478 |
| 2015/0022821 A1 | 1/2015 | Mazzocco et al. |
| 2015/0041359 A1 | 2/2015 | Entegris et al. |
| 2015/0045961 A1 | 2/2015 | Koshti et al. |
| 2015/0170948 A1* | 6/2015 | Hara ................... H01L 21/6773 220/230 |

OTHER PUBLICATIONS

International Preliminary Report on Patentability of International Application No. PCT/US2016/027801 dated Dec. 7, 2017.
International Search Report and Written Opinion of International Application No. PCT/US2016/027801 dated Jul. 26, 2016.

* cited by examiner

SUBSTRATE CARRIER DOOR ASSEMBLIES, SUBSTRATE CARRIERS, AND METHODS INCLUDING MAGNETIC DOOR SEAL

RELATED APPLICATION

The present application claims priority to US Provisional Application No. 62/165,555 filed May 22, 2015, and entitled "SUBSTRATE CARRIER DOOR ASSEMBLIES, SUBSTRATE CARRIERS, AND METHODS INCLUDING MAGNETIC DOOR", which is hereby incorporated by reference herein for all purposes.

FIELD

The present invention relates generally substrate carriers for electronic device manufacturing, and more specifically to sealed substrate carriers.

BACKGROUND

In conventional electronic device manufacturing, substrate carriers may be used to transport substrates within a manufacturing facility (e.g., between tools). In some instances, the substrate carriers may be purged with an inert gas prior to movement from a load port of a respective tool, so that when the substrate carrier is in transit to a next processing location, the substrates carried therein are subjected to the inert gas environment.

However, within a short period of time, oxygen can ingress into the substrate carrier and can come into contact with the substrates carried therein. In order to improve carrier door sealing, magnetic door seals have been added to the carrier door wherein permanent magnets are provided on the carrier door and on the carrier body. These permanent magnets function to assist with carrier door closure and improve sealing of the carrier door to the carrier body. However, although existing magnetic door seals may be effective at minimizing some oxygen ingress into the substrate carrier, they suffer from other problems, and may not effectively address overall oxygen ingress.

Accordingly, improved substrate carriers, electronic device processing systems, and methods enabling improved (e.g., lower) oxygen ingress in substrate carriers are desired.

SUMMARY

In a first aspect, a substrate carrier door assembly is provided. The substrate carrier door assembly includes a carrier door configured to seal to a carrier body, a first attraction member on the carrier body selected from a group of: a magnetic material and a permanent magnet, a second attraction member on the carrier door selected from a group of: a first magnetic material and a permanent magnet, and a magnetic field generator energizable to reduce an attraction force between the first attraction member and the second attraction member making the carrier door relatively easier to remove from the carrier body.

According to another aspect, a substrate carrier assembly is provided. The substrate carrier assembly includes a carrier body, a carrier door configured to seal to a carrier body to form a carrier chamber, a port configured to allow a gas to be injected into, or removed from, the carrier chamber, and a magnetic port seal coupled to the port.

In another aspect, a method of processing substrates is provided. The method of processing substrates includes providing a substrate carrier including a substrate carrier body and a carrier door sealable to the substrate carrier body, providing a first attraction member on the carrier body selected from a group of: a magnetic material and a permanent magnet, providing a second attraction member on the carrier door selected from a group of: a first magnetic material and a permanent magnet, and energizing a magnetic field generator to reduce an attraction force between the first attraction member and the second attraction member making the carrier door relatively easier to remove from the carrier body.

In another aspect, a method of processing substrates is provided. The method includes providing a substrate carrier including a substrate carrier body and a carrier door sealable to the substrate carrier body, a fill port, and a moveable fill port seal operable to seal the fill port, providing a first attraction member on the carrier body selected from a group of: a magnetic material and a permanent magnet, providing a second attraction member on the fill port seal selected from a group of: a first magnetic material and a permanent magnet, and energizing a magnetic field generator configured to reduce an attraction force between the first attraction member and the second attraction member making the moveable fill port seal easier to open.

Numerous other features are provided in accordance with these and other aspects of the invention. Other features and aspects of the present invention will become more fully apparent from the following detailed description, the appended claims and the accompanying drawings.

BRIEF DESCRIPTION OF THE DRAWINGS

A person of ordinary skill in the art will understand that the drawings, described below, are for illustrative purposes only. The drawings are not necessarily drawn to scale, and are not intended to limit the scope of embodiments of the invention in any way. Like numerals are used to designate like components.

DESCRIPTION

In substrate processing, substrates are moved between various manufacturing processes (e.g., between tools) in a factory by being housed and sealed in a chamber of a substrate carrier. Door sealing has been improved in some cases by augmenting the seal pressure with mutually-attracting permanent magnet pairs provided on the carrier body and carrier door. However, this type of magnetic augmentation of the door sealing may increase the force, and thus the difficulty, of removing the carrier door from the carrier body, such as when docked to a load port.

Furthermore, although the door sealing may be improved via magnetic augmentation, other points of oxygen ingress into the chamber of the substrate carrier may be unaddressed at present. For example, the inventors have discovered that sometimes the purge port seals on the substrate carrier may leak. Purge port seals function to attempt to seal the purge port after the addition of an inert gas to the carrier chamber there through.

Thus, in a first embodiment, an improved carrier door assembly of a substrate carrier is provided, wherein the carrier door may be removed with a reduced door opening force. The reduced door opening force is provided by one or more magnetic field generators that are energizable to reduce an attraction force between a first attraction member and a second attraction member making the carrier door relatively easier to remove from the carrier body.

In another embodiment, an improved substrate carrier is provided, wherein the purge port includes magnetically augmented sealing. In some embodiments, the magnetically-augmented sealing may be subject to a magnetic field generator energizable to reduce an attraction force between a first attraction member on the carrier body and the second attraction member on a moveable sealing member of the port seal making the port seal relatively easier to open.

Further details of examples of various embodiments of the invention are described with reference to FIGS. 1A-11 herein.

Figure 1A:
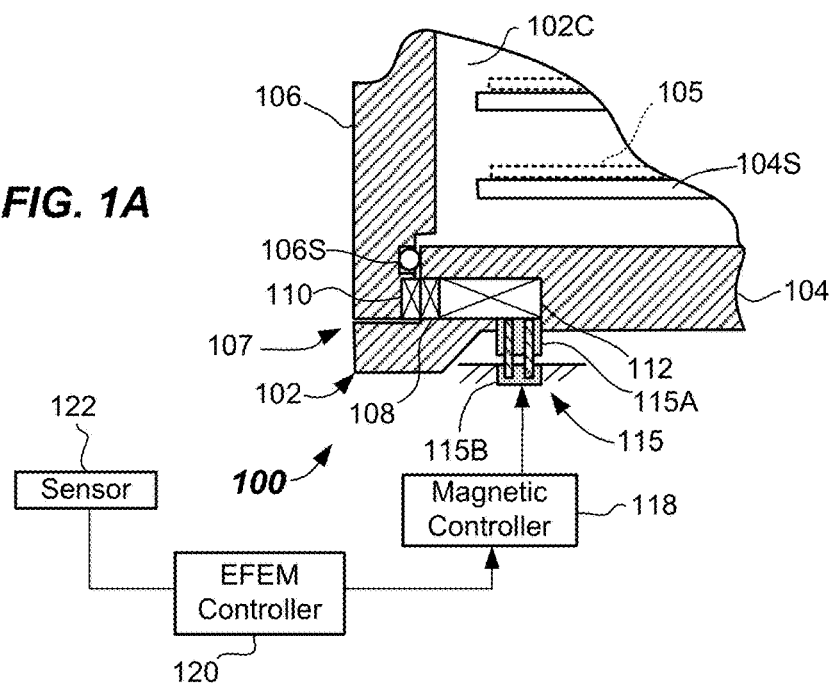
FIG. 1A illustrates a partial cross-sectioned side view of a substrate carrier including a magnetically-assisted carrier door assembly according to one or more embodiments.
Figure 1B:
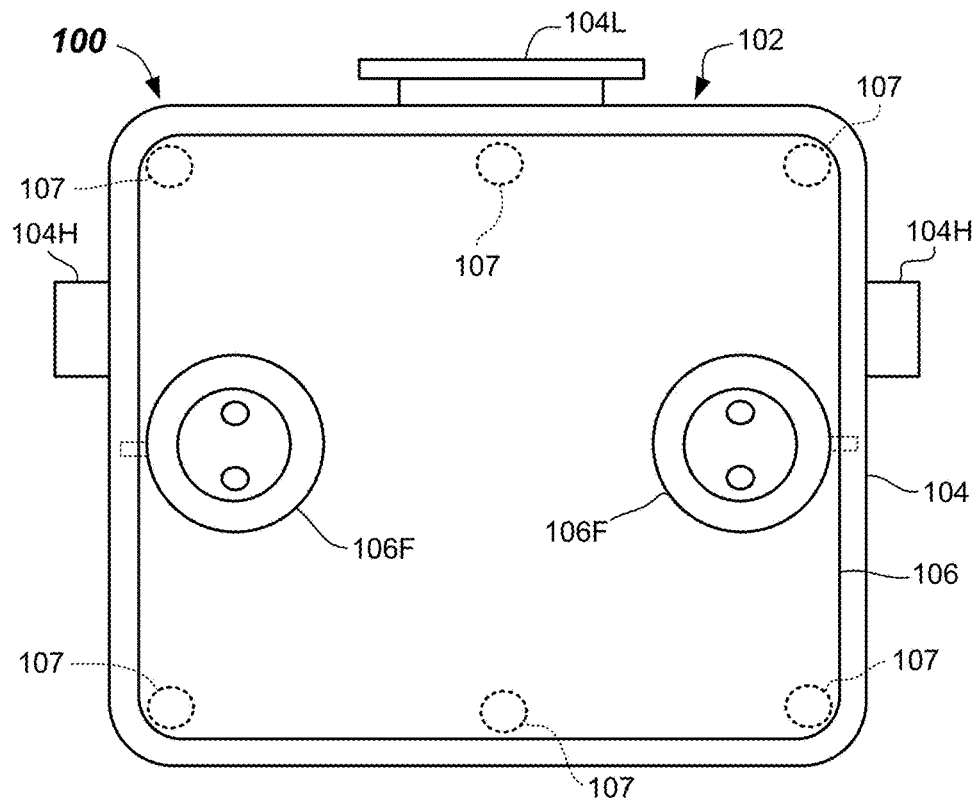
FIG. 1B illustrates a front view of a substrate carrier including a magnetically-assisted carrier door assembly according to one or more embodiments.

Referring now to FIGS. 1A and 1B, is a first example embodiment of a substrate carrier door assembly 100 is shown. Substrate carrier door assembly 100 functions to allow improved sealing of a substrate carrier 102. Substrate carrier door assembly 100 includes a carrier body 104 and a carrier door 106 which is removable from the carrier body 104. The substrate carrier 102 includes a chamber 102C, which may include an inert gas (e.g., $N_2$ gas) at timed, such as during transit. The carrier body 104 may include internal supports 104S on the lateral sides thereof that support one or more substrates 105 (otherwise referred to as "wafers") therein. Substrates 105 may be 300 mm or 450 mm semiconductor substrates, for example. However, other types of substrates 105 comprising a semiconductor material may be carried therein. The substrate carrier 102 may be a front opening universal pod (FOUP) and may carry between about 1 and about 32 substrates 105, for example. Other sizes may be used. The carrier body 104 may include handles 104H and/or a lift 104L adapted to be engaged by a robot (not shown) to move the substrate carrier 102. The carrier door 106 is configured to seal to a carrier body 104 by a seal 106S. Seal 106S may be formed on the carrier door 106, or optionally on the carrier body 104. Seal 106S may be an O-ring seal, a molded seal, gasket, or other suitably compliant sealing material, such as an elastomer. Carrier door 106 and carrier body 104 may be made of a plastic material, for example. Other materials may be used. Carrier door 106 may include one or more lock features 106F that may be engaged by a door opener (not shown) to unlock the carrier door 106 from the carrier body 104 and facilitate removal therefrom so that the substrates 105 may be accessed therein.

Substrate carrier door assembly 100 further includes one or more force assemblies 107 including at least a first attraction member 108 positioned on the carrier body 104, and at least a second attraction member 110 positioned on the carrier door 106. In one or more embodiments, a number of the force assemblies 107 may be spaced about the perimeter of the carrier door 106. For example, force assemblies 107 may be located such as at some of the corners (e.g., at two diagonal corners, or at the four corners) and/or along two or more of the sides of the carrier door 106 (e.g., along the top and bottom sides). Possible locations of the force assemblies 107 are shown dotted in FIG. 1B). The number of force assemblies may number 2, 3, 4, 5, 6, or more.

Both the first attraction members 108 and second attraction members 110 may be selected from a group of: a magnetic material and a permanent magnet. The magnetic material may be any suitable magnetically-susceptible material, such as steel. The permanent magnet may be a neodymium iron boron (NdFeB), samarium cobalt (SmCo), alnico (Aluminum Nickel Cobalt alloy), or a ceramic or ferrite magnet (ceramic-like material that is made from a mix of iron oxides with nickel, strontium, or cobalt). The permanent magnets may be disc magnets, ring magnets, bar magnets or other suitable magnet types.

In one or more embodiments, the first attraction member 108 may be a steel disc, and the second attraction 110 member may be a disc permanent magnet. In other embodiments, both the first and second attraction members may be permanent magnets. The permanent magnets may be sized and have a magnetic strength sufficient to add an attractive force per force assembly 107. The attractive force per force assembly 107 may be greater than about 0.5 lb. (2.2 N), or greater than 1.0 lb. (4.5 N), or greater than about 2.0 lb. (8.9 N), or greater than about 3.0 lb. (13.4 N), or even or greater than about 4.0 lb. (17.8 N), for example. Disc magnet may have a diameter between about 0.25 inch (6.4 mm) and 0.75 inch (19.0 mm) and a thickness between 0.125 inch (6.4 mm) and about 1.0 inch (25.4 mm), for example. The steel disc may have a same or similar shape. Other sizes may be used.

EXAMPLE DISC MAGNET

Magnet type—NdFeB, Grade N52
Axially magnetized (poles on flat ends)
0.3125 inch diameter (7.9 mm)
0.125 thick (3.2 mm)

Against a steel disc, this example permanent magnet is capable of producing about 4 lb. of attractive force at 5 A current. If both the first and second attraction members 108, 110 are these types of permanent magnets, the generated attraction force may be about 8 lb. So, if four force assemblies are used on the four corners of the substrate carrier 102, an attractive force of about 24 lbs. may be generated. This attractive force supplements sealing of the carrier door 106 to the carrier body 104.

The one or more force assemblies 107 of the substrate carrier door assembly 100 further includes one or more magnetic field generators 112. Magnetic field generators 112 may be energizable to reduce an attraction force between the first attraction member 108 and the second attraction member 110 at selected times. This is accomplished by producing an interfering magnetic field. This may make the carrier door 106 relatively easier to remove from the carrier body 104.

In the depicted embodiment of FIGS. 1A-1B, the magnetic field generator 112 is positioned on the carrier body 104, such as in a pocket formed (e.g., molded) therein. The magnetic field generator 112 may include, as shown in FIG. 7A, a wire coil 714 which may be coiled about a core 716. In some instances, the wire coil 714 may be wound on a bobbin and the core 716 may be inserted therein. Wire coil 714 may include about 100 wraps of a 14-32 gauge copper magnet wire (e.g., 24 gauge coated wire). Core 716 may be a steel rod having a diameter (d) of between about 0.125 (3.2 mm) and 0.75 inch (10.0 mm) or about 0.25 inch (6.4 mm) in some embodiments, and a length (L) of between about 0.25 inch (6.4 mm) and 1.25 inch (31.8 mm) and about 0.75 inch (19 mm) in some embodiments. Other suitable sizes may be used depending upon the force desired to be generated and the space and power available (e.g., 1 A-10 A at 12V-24V DC). The strength of the magnetic field generator 112 may be adjusted by changing the gauge of the wire coil 714, the number or winds of the wire coil 714, the inner diameter of the wire coil 714 and the length of the wire coil 714. Magnetic field generator 112 may be positioned as close as possible to the first attraction member 108 (e.g., within about 1 mm or less, for example). Likewise, the first attraction member 108 and the second attraction member 110 may be positioned as close as possible to one another (e.g., within about 1 mm or less, for example). Magnetic field generator 112 may produce an equivalent field force of greater than about 1 lb. (4.5 N), greater than about 2 lb. (9.0 N), greater than about 3 lb. (13.4 N), or even greater than about 4 lb. (17.9 N), or even more. This force produced is in opposition to the attraction force between the first and second attraction members 108, 110.

A magnetic controller 118 may be electrically coupled to the magnetic field generator 112 and operable to modulate a magnetic field generated by the magnetic field generator 112. Magnetic controller 118 may provide suitable current to the magnetic field generator 112 to energize same. The current may flow through a coupling 115. For example, a first coupling member 115A may be secured to the outside of the carrier body 104 and engage a second coupling member 115B located on the shelf that the substrate carrier 102 rests upon during docking. Thus, the electrical connection may be made during docking. Some portion of the connection may be spring loaded, such as a spring-loaded sheath to minimize the shock hazard. Magnetic controller 118 may include suitable AC power supply, AC/DC converter, RC driver and control processor, such as a 555 chip. However, any suitable circuit and circuit components of the magnetic controller 118 may be used for controlling the applied current to the magnetic field generator 112 between an OFF condition and an ON condition (energized) may be used.

In the OFF configuration, no current is supplied to the magnetic field generator 112 and thus the full attraction force between the first and second attraction members 108, 110 is present. This assists the sealing provided by the seal 106S and the sealing force provided by the lock features 106F. When the equipment front end module (EFEM) controller 120 senses that the substrate carrier 102 is docked at a load port, such as by a signal generated by a sensor 122, then the EFEM controller 120 may send a signal to the magnetic controller 118 to initiate a drive current to energize the magnetic field generator 112. The sensor 122 may be a position sensor that senses when the substrate carrier 102 is either received on the docking shelf or actually docked to the EFEM. The EFEM controller 120 and the magnetic controller 118 may consolidated in some embodiments as one controller, or may be separate.

The magnetic field generated by energizing the magnetic field generator 112 may be of sufficient magnitude and direction to lower the attractive force between the first and second attraction members 108, 110. In some embodiments, the magnetic field produced by the magnetic field generator 112 may be of as magnetic strength sufficient to counteract at least the force generated by one of the first or second attraction members 108, 110. Thus, in the case where one attraction member (e.g., second attraction member 110) is a steel disc and the other attraction member (e.g., first attraction member 108) is a disc permanent magnet, the field generated may be sufficient to cancel the attractive force generated between the first and second attraction members 108, 110. In other words, a net zero force condition on the carrier door 106 may be produced, such that the carrier door 106 may be easily removed from the carrier body 104 by the door opener.

Provided that sufficient space is present to house the magnetic field generator 112, the force may be large enough to actually cause the first and second attraction members 108, 110 to repel one another and assist with separation of the carrier door 106 from the carrier body 104.

Figure 2:
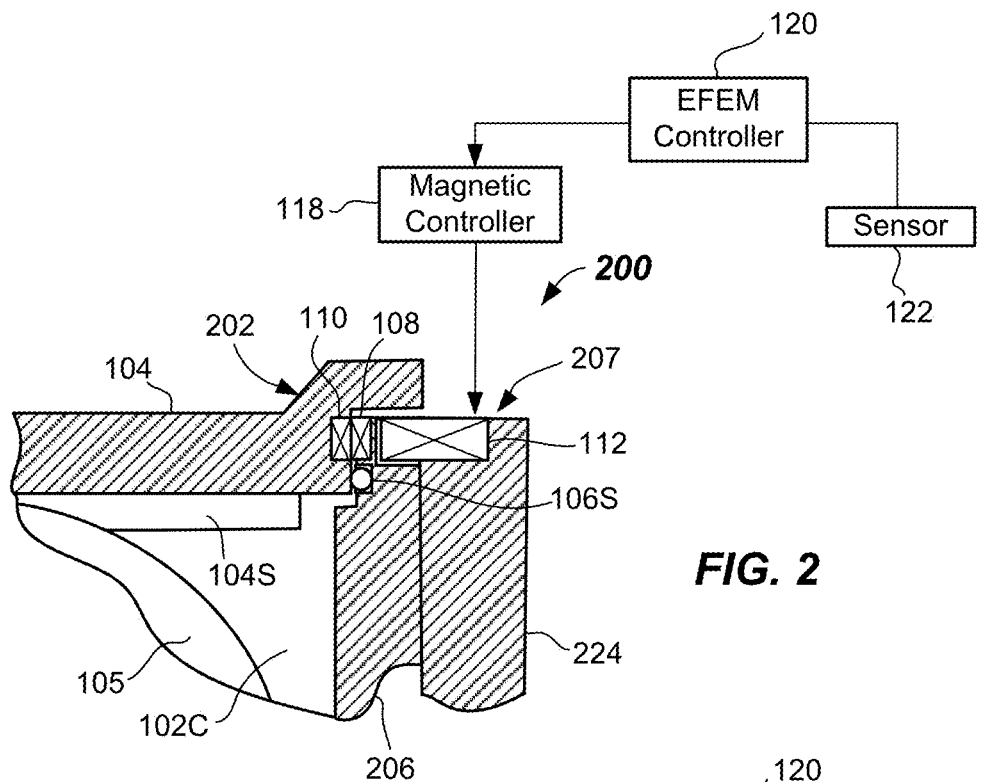
FIG. 2 illustrates a partial cross-sectioned side view of a substrate carrier including a magnetically-assisted carrier door assembly with the magnetic field generator mounted to the door opener according to one or more embodiments.

Another embodiment of substrate carrier door assembly 200 is shown in FIG. 2. In this embodiment, the magnetic field generator 112 may be positioned on a door opener 124 that is coupleable to the carrier door 206 to open and remove the carrier door 206 such that the substrates 105 may be accessed and moved to a processing location of the tool. The positions and structure of the first and second attraction members 108, 110 may be as described above.

In accordance with one or more embodiments of the invention, a substrate carrier door assembly 200 does not use a coupling, as the door opener 224 includes the magnetic field generator 112. This may simplify the construction of the substrate carrier 202 to include only passive magnetic components. In operation, after docking, the door opener 224 is moved towards the carrier door 206 such as by a suitable door opener mechanism (not shown). This moves the magnetic field generator 112, that is rigidly coupled to the door opener 224, into close proximity with the second attraction member, as shown (e.g., within about 1 mm or less). In this embodiment, the first attraction member 108 of the force assembly 207 may be a disc permanent magnet, and the second attraction member 110 may be a steel disc or a disc permanent magnet. Energizing the magnetic field generator 112 may lower the force generated by the force assembly 207 due to magnetic field interference and partial or full cancellation, and thus makes it easier for the door opener 224 to remove the carrier door 206.

Figure 3:
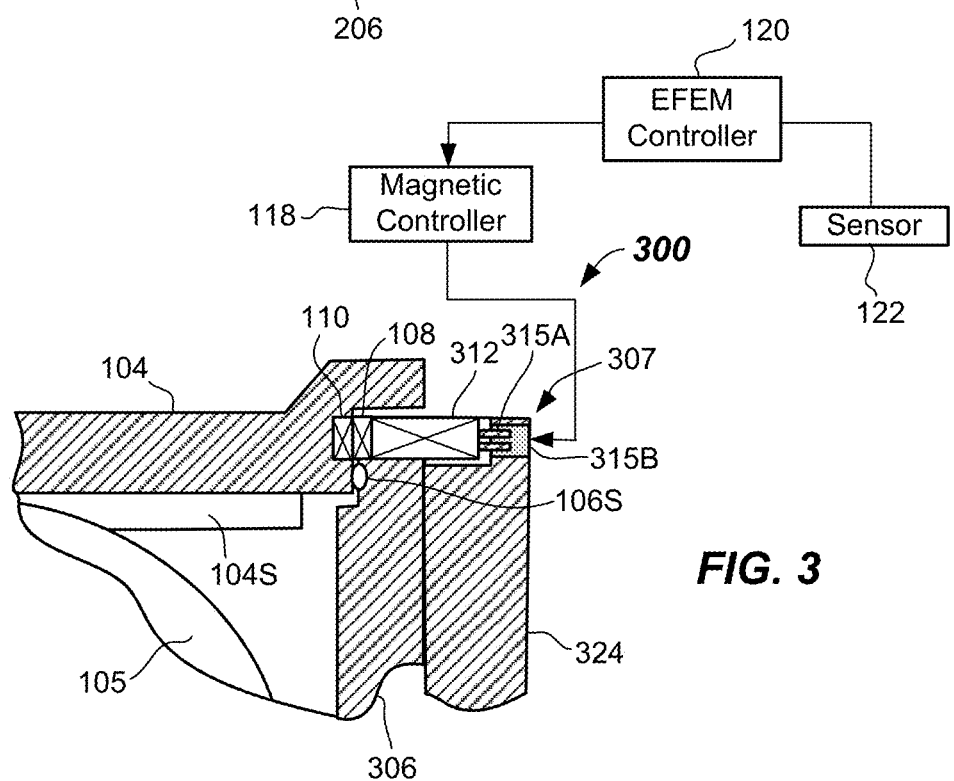
FIG. 3 illustrates a partial cross-sectioned side view of a substrate carrier including a magnetically-assisted carrier door assembly with the magnetic field generator mounted to the carrier door according to one or more embodiments.

Another embodiment of carrier door assembly 300 and force assembly 307 is shown in FIG. 3. In this embodiment, the magnetic field generator 312 may be positioned on the carrier door 306 and thus includes a first coupling member 315A that engages with a second coupling member 315B on the door opener 324 to provide current. Each coupling may include two conductive paths adapted to power the magnetic field generator 312. Optionally, more than one couple may be used to energize the magnetic field generator 312. Thus, the magnetic field generator 312 couples to and receives power from a door opener 224. Multiple magnetic field generators 312 may be daisy chained together in series and energized by engaging first and second coupling members 315 or optionally from multiple couplings. As before, the magnetic field generator 312 may be energized to lower a force to open and remove the carrier door 306 such that the substrates 105 may be accessed and moved to a processing location of the tool. The positions and structure of the first and second attraction members 108, 110 may be as described above. In this embodiment, the magnetic field generator 312 and first attraction member reside with and are rigidly connected to the carrier door 306.

In operation, after docking, the door opener 324 is moved towards the carrier door 306 such as with a suitable mechanism (not shown). This moves the second coupling member 315B towards the magnetic field generator 112 that is rigidly coupled to the carrier door 306.

In this embodiment, the first attraction member 108 of the force assembly 307 may be a disc permanent magnet, and the second attraction member 110 may be a steel disc or a disc permanent magnet. Energizing the magnetic field generator 312 positioned adjacent to the first attraction member 108 lowers the force generated by the force assembly 307, and thus makes it easier for the door opener 324 to remove the carrier door 306.

Figure 4:
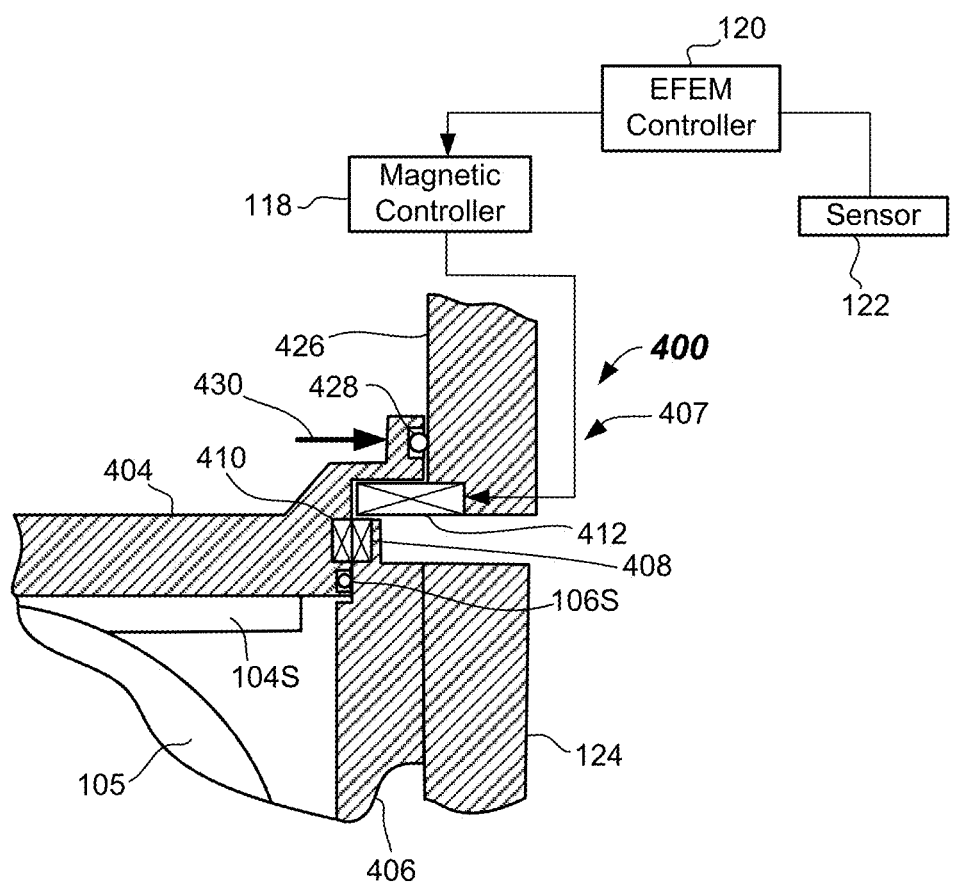
FIG. 4 illustrates a partial cross-sectioned side view of a substrate carrier including a magnetically-assisted carrier door assembly with the magnetic field generator mounted to a load port according to one or more embodiments.

Another embodiment of carrier door assembly 400 and force assembly 407 is shown in FIG. 4. In this embodiment, the magnetic field generator is positioned on a load port, and the carrier body 404 is coupleable to the load port. Magnetic field generator 412 may be positioned and rigidly mounted on a wall 426 of the load port. Again this configuration has the benefit of no coupling, but also has no moving wires. Thus, as before, the magnetic field generator 412 may be energized to reduce the force to open and remove the carrier door 406 such that the substrates 105 may be accessed and moved to a processing location of the tool. The positions and structure of the first and second attraction members 108, 110 may be as described above. In this embodiment, however, the first and second attraction members 108, 110 may be bar magnets as will be described below.

In operation, after docking and sealing the carrier body 404 to the wall 426 via wall seal 428 and clamping mechanism 430 (designated as an arrow), the door opener 124 is moved towards the carrier door 406 such as with a suitable mechanism (not shown). Once the door opener 124 is coupled to the carrier door 406, the magnetic field generator 412 may be energized via a current from the magnetic controller 118 to reduce the force to open the carrier door 406.

Figure 8:
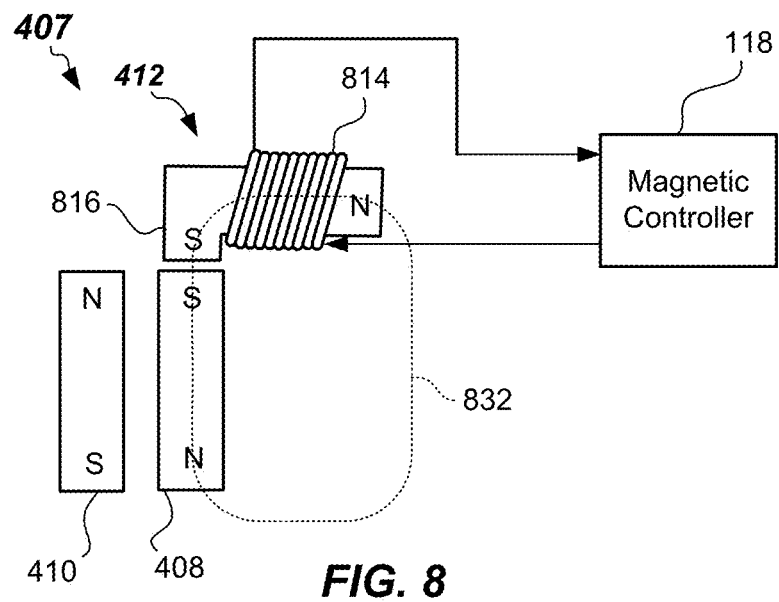
Figure 9:
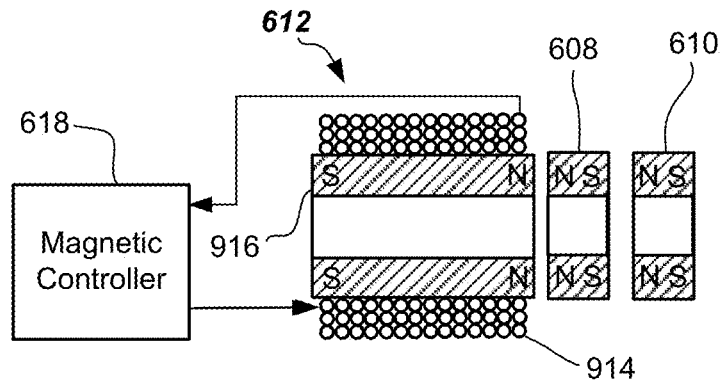

In this embodiment, the first attraction member 408 of the force assembly 407 may be a bar permanent magnet, and the second attraction member 410 may be a steel bar or a bar permanent magnet. Bar magnets may be axially magnetized as shown in FIG. 8. As shown in FIG. 8, the magnetic field generator 412 may include a wire coil 814 and a core 816. In this embodiment, the core 816 may include an end piece that is bent and directed towards an end of the first attraction member 408. Energizing the magnetic field generator 412 creates a magnetic field 832 that effectively counteracts either partly or fully the magnetic field of the first attraction member 408 thus reducing the force needed to open the carrier door 406. Once the carrier door 406 has been moved away from the carrier body 404 a sufficient distance, the magnetic field generator 412 may be de-energized.

Figure 5:
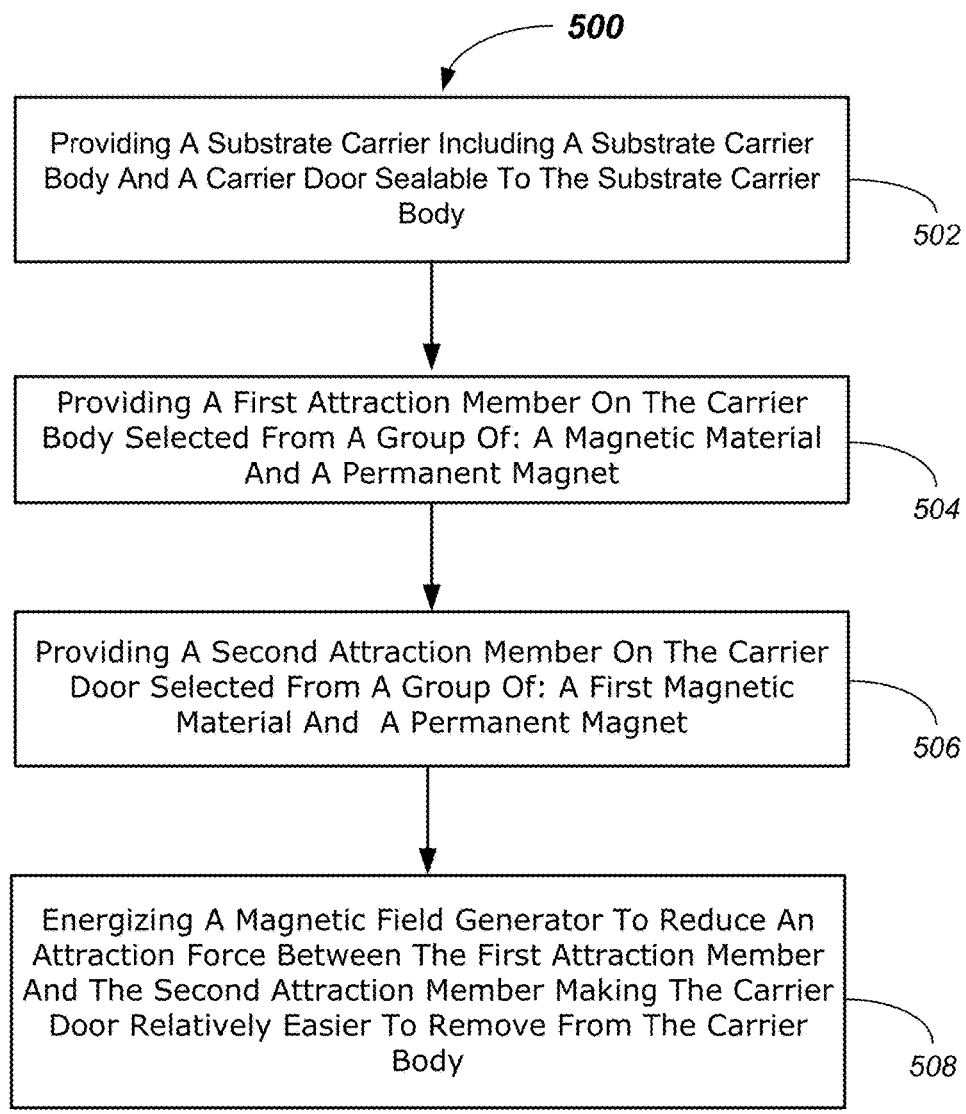
FIG. 5 illustrates a flowchart of a method of processing substrates including a magnetically-assisted carrier door assembly according to one or more embodiments.

FIG. 5 illustrates a flowchart of an embodiment of a method of processing substrates. The method 500 includes, in 502, providing a substrate carrier (e.g., substrate carrier 102) including a substrate carrier body (e.g., carrier body 104) and a carrier door (e.g., carrier door 106) sealable to the substrate carrier body, and, in 504, providing a first attraction member (e.g., first attraction member 108) on the carrier body selected from a group of: a magnetic material and a permanent magnet.

The method 500 includes, in 506, providing a second attraction member (e.g., second attraction member 110) on the carrier door selected from a group of: a first magnetic material and a permanent magnet, and, in 508, energizing a magnetic field generator (e.g., magnetic field generator 112) to reduce an attraction force between the first attraction member and the second attraction member. This makes the carrier door (e.g., carrier door 106) easier to remove from the carrier body (e.g., carrier body 104) by lowering the attraction forces between the carrier body (e.g., carrier body 104) and the carrier door 106. (e.g., carrier door 106).

Figure 6:
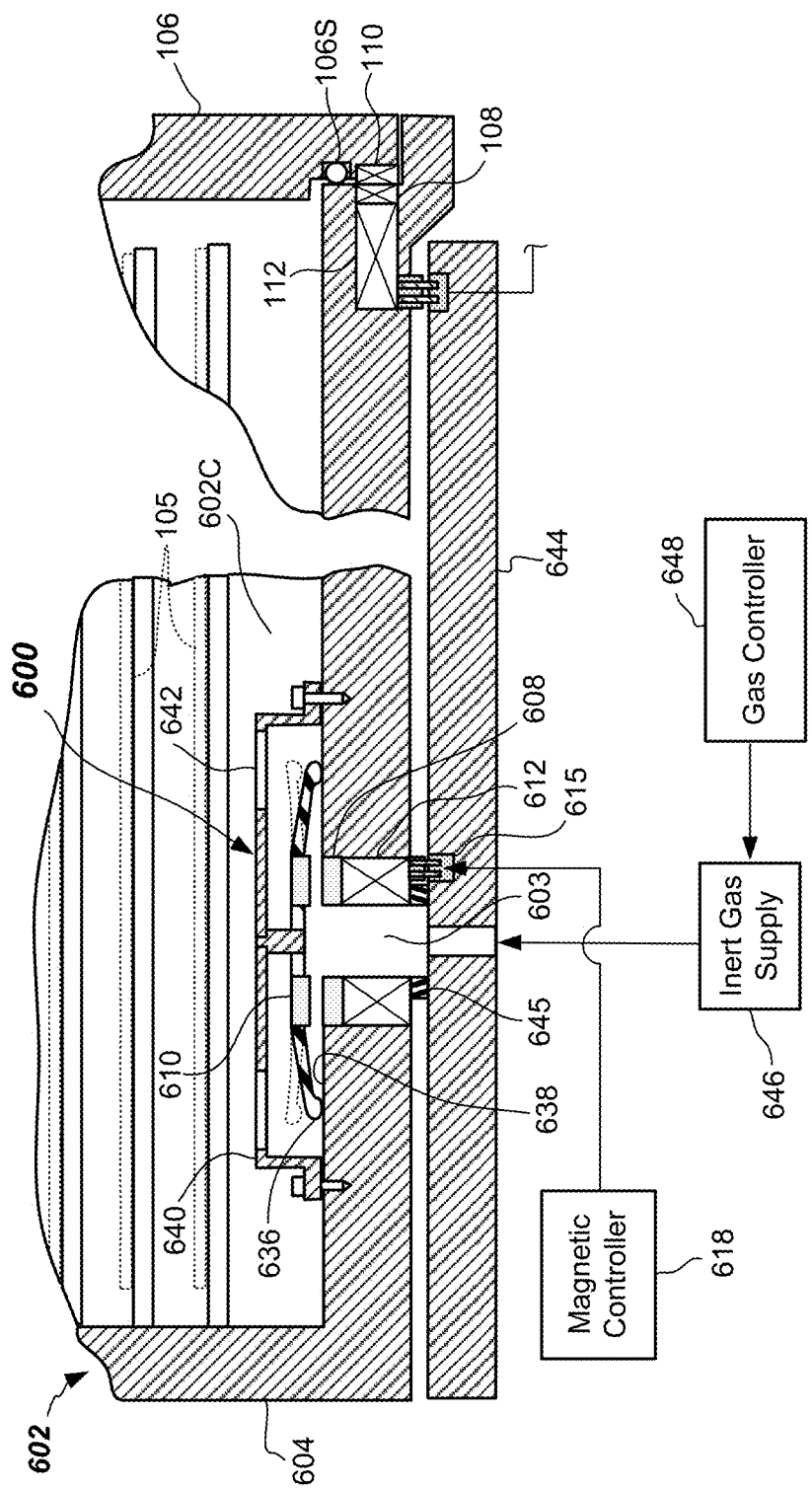
FIG. 6 illustrates a partial cross-sectioned side view of a substrate carrier including a magnetically-assisted port and magnetically-assisted carrier door assembly according to one or more embodiments.
Figure 7:
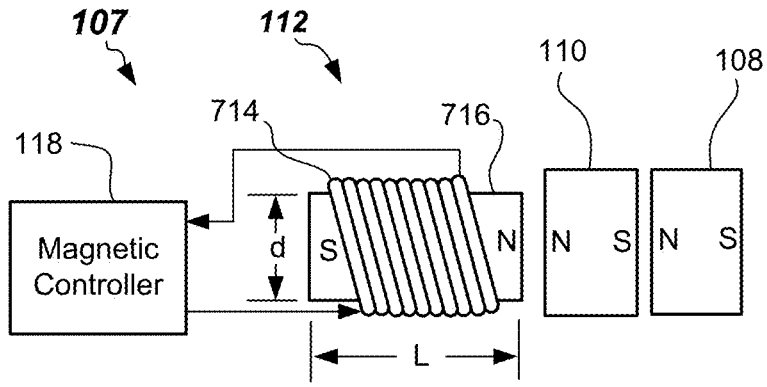
FIGS. 7-9 illustrate schematic views of force assemblies for providing magnetic forces according to one or more embodiments.

FIG. 6 illustrates an embodiment of magnetic port seal 600 included in a substrate carrier 602. In this embodiment, the sealing of a port 603 is augmented via one or more attraction members. In more detail, the substrate carrier 602 includes a carrier body 604 (e.g., a box like body), and a carrier door 106 configured to seal to the carrier body 604 to form a carrier chamber 602C therein. Carrier chamber 602C includes substrates 105 therein.

Substrate carrier 602 further includes a port 603 configured to allow a gas to be injected into, or removed from, the carrier chamber 602C. A fill port is shown, but embodiments of the invention are equally useful for purge ports. For example, an inert gas, such as $N_2$ may be injected into the carrier chamber 602C through the port 603 to substantially remove any oxygenated environment in the carrier chamber 602C to a relatively low level (e.g., less than 500 ppm $O_2$). Humidity may also be reduced. In some embodiments, a purge port (not shown) will be provided as well so that the fill port 603 may receive in flow and the purge port may receive outflow from the carrier chamber 602C.

To augment sealing of the port 603, a magnetic port seal 600 is coupled to the port 603. In one or more embodiments, the magnetic port seal 600 may include a moveable sealing member 636 adapted to seal against a sealing surface 638 around the port 603. Magnetic port seal 600 may include a first attraction member 608 and a second attraction member 610. First attraction member 608 may be associated with the moveable sealing member 636 and the second attraction member 610 may be associated with the sealing surface 638. First attraction member 608 and second attraction member 610 may be selected from a group of: a magnetic material and a permanent magnet.

As depicted in FIG. 6, the first attraction member 608 may be provided (e.g., bonded or fastened) on a portion of the moveable sealing member 636, wherein the second attraction member 610 is provided on the carrier body 604.

Magnetic port seal 600 may include a magnetic field generator 612 operable to reduce an attraction force between the first attraction member 608 and the second attraction member 610 making the moveable sealing member 636 easier to move relative to the sealing surface, such as when a fill operation is being undertaken. Once the fill operation is completed, the sealing force may be returned to a relatively higher value.

In the depicted embodiment, the magnetic field generator 612 is provided on the carrier body 604, such as in a pocket thereof. The magnetic field generator 612 may include a wound coil 914 and a core 914 as before described. However, in this embodiment, the core 916 may be an annulus with the port 603 through the center thereof. Further, in this embodiment, the first and second attraction members 608, 610 may also include an annular shape. For example, the first attraction member 608 may be a ring permanent magnet that is axially magnetized. The second attraction member 610 may be an annular or ring-shaped piece of steel or a ring permanent magnet that is axially magnetized. As normally configured, the poles are oriented so that the first and second attraction members 608, 610 are attracted to one another.

In the depicted embodiment, the moveable sealing member 636 may be supported at one portion by a support member 640 coupled to the carrier body 604. Support member 640 may include one or more passages 642 allowing fluid communication between the port 603 and the carrier chamber 602C when the moveable sealing member 636 is opened accepting fill gas (configuration of the moveable sealing member 636 being open is shown dotted). Moveable sealing member 636 may be a compliant disc of an elastomer material opening in response to fill pressure applied to the port 603.

Similar to the door embodiment, the electrical connection to the magnetic field generator 612 may be accomplished by a coupling 615. As the substrate carrier 602 is lowered onto the shelf 644, a bottom of the substrate carrier 602 seals against ring seals 645 formed on the shelf 644 and the electrical connection is made to the magnetic field generator 612 through coupling 615. Once positioned on the shelf 644, the substrate carrier 602 may be locked in place by any suitable locking mechanism (not shown). A sensor as heretofore described may indicate to the EFEM controller 120 that the substrate carrier 602 is in place and send a signal to the magnetic controller 618 at a scheduled time for gas fill/purge.

Prior to initiating a fill with inert gas, the magnetic controller 618 may cause the magnetic field generator 612 to be energized to reduce the attractive force between the first and second attraction members via magnetic field interference making the moveable sealing member 636 easier to move relative to the sealing surface 638.

Once energized, fill may commence by proving inert gas from inert gas supply 646 responsive to a signal from the gas controller 648. Once filled as desired, the magnetic field generator 612 may be de-energized. This returns the augmenting attractive force between the first and second attraction members 608, 610 back to a normal state, thus augmenting the sealing between the moveable sealing member 636 and the sealing surface 638. In the depicted embodiment, the magnetic field generator 612 may comprise a coil wound about an annular core, and the first attraction member 608 may comprise a ring magnet that is axially magnetized.

Figure 10:
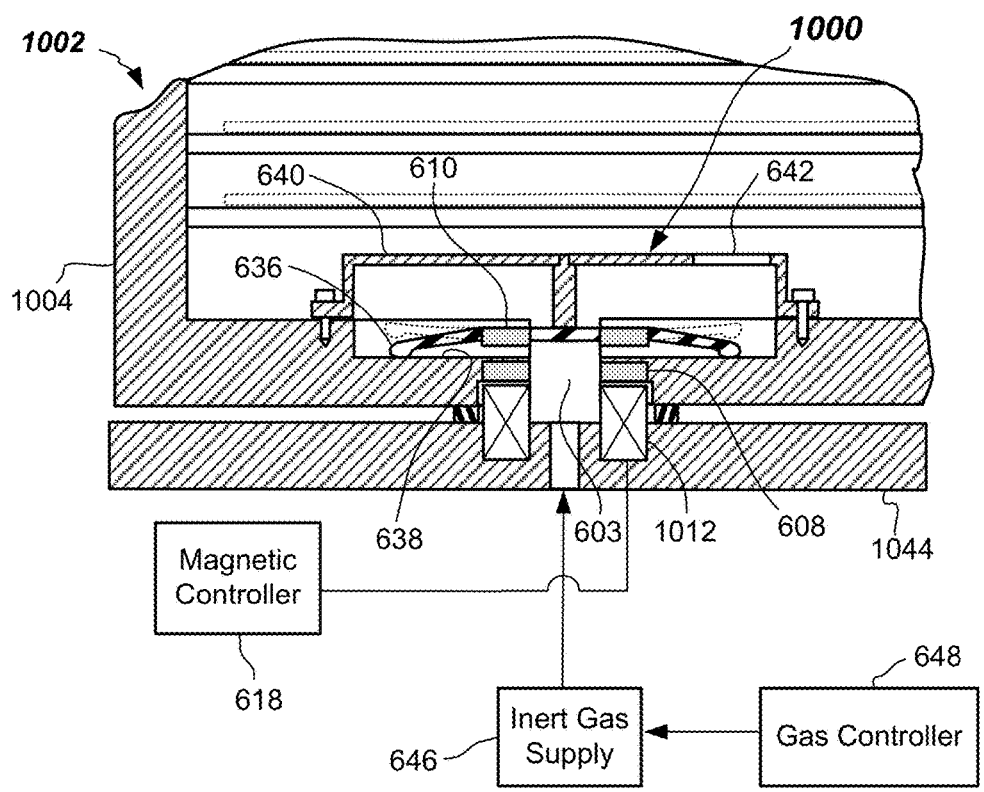
FIG. 10 illustrates a partial cross-sectioned side view of a substrate carrier including a magnetically-assisted port.

In another embodiment shown in FIG. 10, the magnetic field generator 1012 of the magnetic port seal 1000 is provided on a shelf 1044 to which the carrier body 1004 is coupled. The first attraction member 608 is associated with the sealing surface 638 and the second attraction member 610 is associated with the moveable sealing member 636, as before. The magnetic field generator 1012 is mounted to the shelf 1044 and is brought into close proximity to the first attraction member 608 upon engaging the substrate carrier 1002 with the shelf 1044. This configuration eliminates any electrical couplings from the substrate carrier 1002.

Figure 11:
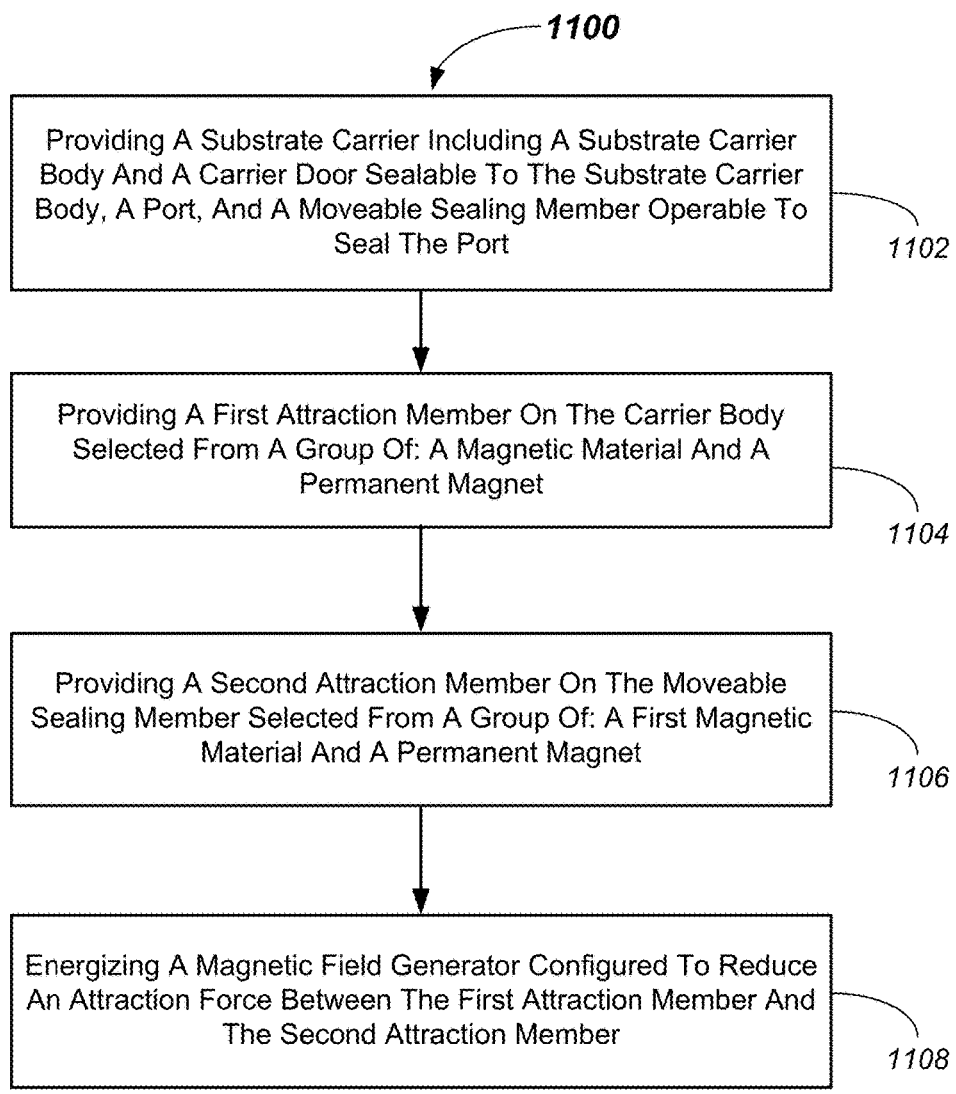
FIG. 11 illustrates a flowchart depicting a method of operating a magnetically-assisted port according to one or more embodiments.

FIG. 11 illustrates another method of processing substrates, wherein the processing includes transport of the substrates in a substrate carrier while under a controlled gas environment. The method 1100 includes, in 1102, providing a substrate carrier (e.g., substrate carrier 602) including a carrier body (e.g., carrier body 604) and a carrier door (e.g., carrier door 606) sealable to the substrate carrier body, a port (e.g., port 603), and a moveable sealing member (e.g., moveable sealing member 636) operable to seal the port.

The method 1100 includes, in 1104, providing a first attraction member (e.g., first attraction member 608) on the carrier body selected from a group of: a magnetic material and a permanent magnet.

The method 1100 includes, in 1106, providing a second attraction member (e.g., second attraction member 610) on the moveable sealing member selected from a group of: a first magnetic material and a permanent magnet.

The method 1100 further includes, in 1108, energizing a magnetic field generator (e.g., magnetic field generator 612) configured to reduce an attraction force between the first attraction member and the second attraction member. This makes the moveable sealing member easier to open during a gas fill operation.

The foregoing description discloses only example embodiments of the invention. Modifications of the above-disclosed assemblies, apparatus, and methods which fall within the scope of the invention will be readily apparent to those of ordinary skill in the art. Accordingly, while the present invention has been disclosed in connection with example embodiments thereof, it should be understood that other embodiments may fall within the scope of the invention, as defined by the appended claims.

The invention claimed is:

1. A substrate carrier door assembly, comprising:
a carrier door configured to seal to a carrier body;
a first attraction member on the carrier body selected from a group of: a magnetic material and a permanent magnet;
a second attraction member on the carrier door selected from a group of: a first magnetic material and a permanent magnet; and
a magnetic field generator energizable to reduce an attraction force between the first attraction member and the second attraction member making the carrier door relatively easier to remove from the carrier body.

2. The substrate carrier door assembly of claim 1, wherein the magnetic field generator is positioned on the carrier body.

3. The substrate carrier door assembly of claim 1, wherein the magnetic field generator is positioned on a door opener coupleable to the carrier door.

4. The substrate carrier door assembly of claim 1, wherein the magnetic field generator is positioned on the carrier door.

5. The substrate carrier door assembly of claim 1, wherein the magnetic field generator couples to and receives power from a carrier door opener.

6. The substrate carrier door assembly of claim 1, wherein the magnetic field generator is positioned on a load port and the carrier body is coupleable to the load port.

7. The substrate carrier door assembly of claim 1, comprising a magnetic controller electrically coupled to the magnetic field generator and operable to modulate a magnetic field generated by the magnetic field generator.

8. The substrate carrier door assembly of claim 7, wherein the magnetic controller receives a signal from an equipment front end module controller to energize the magnetic field generator.

* * * * *